United States Patent [19]

Murakami et al.

[11] Patent Number: 5,440,980

[45] Date of Patent: Aug. 15, 1995

[54] SQUEEGEE FOR SCREEN PRINTING MACHINE

[75] Inventors: Takehiko Murakami; Kunio Kondo, both of Fuchu, Japan

[73] Assignee: Minami Engineering Co., Ltd., Japan

[21] Appl. No.: 252,653

[22] Filed: Jun. 1, 1994

[30] Foreign Application Priority Data

Aug. 27, 1993 [JP] Japan .................. 051419

[51] Int. Cl.⁶ .................. B41F 15/44; B41F 15/00
[52] U.S. Cl. .................. 101/123; 101/121; 101/114
[58] Field of Search .................. 101/116–120, 101/123, 124, 115, , 121, 129, 122, 127.1, 114

[56]  References Cited

U.S. PATENT DOCUMENTS

| 3,934,502 | 1/1976 | Marino | 101/115 |
|---|---|---|---|
| 3,960,076 | 6/1976 | Wick | 101/119 |
| 3,969,999 | 7/1976 | Zimmer | 101/120 |
| 4,329,936 | 5/1982 | Heist et al. | 101/120 |
| 4,905,591 | 3/1990 | van Mondfrans et al. | 101/115 |
| 4,920,914 | 5/1990 | Zimmer | 101/120 |
| 4,949,636 | 8/1990 | Tachibana | 101/123 |

Primary Examiner—Edgar S. Burr
Assistant Examiner—Lynn D. Hendrickson

[57]  ABSTRACT

A squeegee apparatus for a screen printing machine wherein the vertical operation rod being connected to the moving shaft of the air cylinder fixed to the horizontal movement plate of the squeegee drive section, the cushion member being provided between the vertical operation rod and the vertical movement support rod of the squeegee holder, and the guide posts having stoppers at their top ends being provided on the vertical movement support rod which are slidably inserted through the guide sleeves of the vertical operation rod.

3 Claims, 2 Drawing Sheets

SQUEEGEE FOR SCREEN PRINTING MACHINE

BACKGROUND OF THE INVENTION

The present invention relates to a squeegee for a screen printing machine.

In a conventional squeegee apparatus in a screen printing machine, since a vertical position of the squeegee is fixed, when the squeegee is moved on and along a mask, the squeegee is moved horizontally with a constant height relative to the mask.

For this reason, when the mask is warped wavy, there is a problem. Namely, when parts of the mask are either projected upwardly or recessed, the contact pressure of the squeegee with the mask is varied. As a result, there is a difference in an amount of cream solder or ink flowing into screen holes of the mask, resulting in non-uniformity in application. Also, if the squeegee would be remarkably stressed, the squeegee were to damaged by corners of the screen holes of the mask. In the worst case, the squeegee would scrape the cream solder or the like away from the holes of the mask.

SUMMARY OF THE INVENTION

In view of the foregoing defects, an object of the present invention is to provide a squeegee apparatus in which a cushioning function is imparted to a squeegee to thereby contact an overall mask surface at a uniform pressure while conforming with distortion or warpage of the mask.

According to the present invention, the squeegee apparatus for a screen printing machine is characterized in that the squeegee is held through a cushioning member. In more detail, a suitable pressure is imparted to an operating member which may project or retract relative to a sleeve body by using an internal pressure imparting means such as a hydraulic device or a spring device.

In operation, in the case where the mask is wavy in the mid way of the movement of the squeegee, the squeegee is displaced in a vertical direction by the cushioning effect of the cushioning member provided between a vertically movement support rod and a vertical operation rod connected to a moving shaft of a vertical movement air cylinder. As a result, the contact pressure of the squeegee will not vary greatly between the corrugated portion and the flat portion of the mask. Incidentally, when the squeegee is moved up and down, the vertical movement support rod is guided during offset in the vertical direction by a pair of guide posts. When the squeegee is lifted up, the air cylinder is actuated. The guide posts are raised upwardly by the vertical operation rod fixed to the moving shaft of the air cylinder so that the vertical movement support rod is also raised upwardly.

DESCRIPTION OF THE PREFERRED EMBODIMENT

Figure 1:
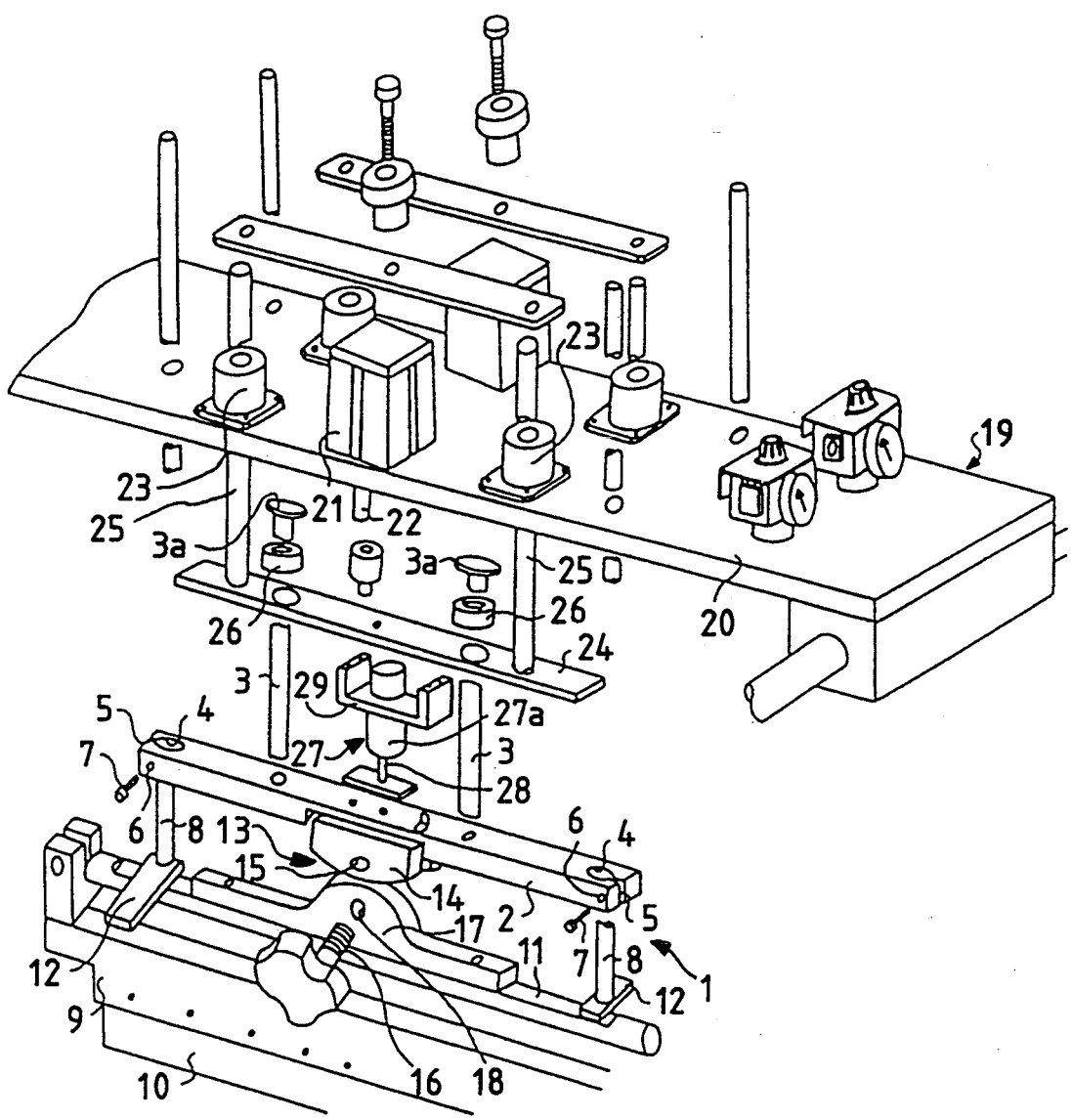
FIG. 1 is an exploded perspective view showing a squeegee apparatus in accordance with the present invention.
Figure 2:
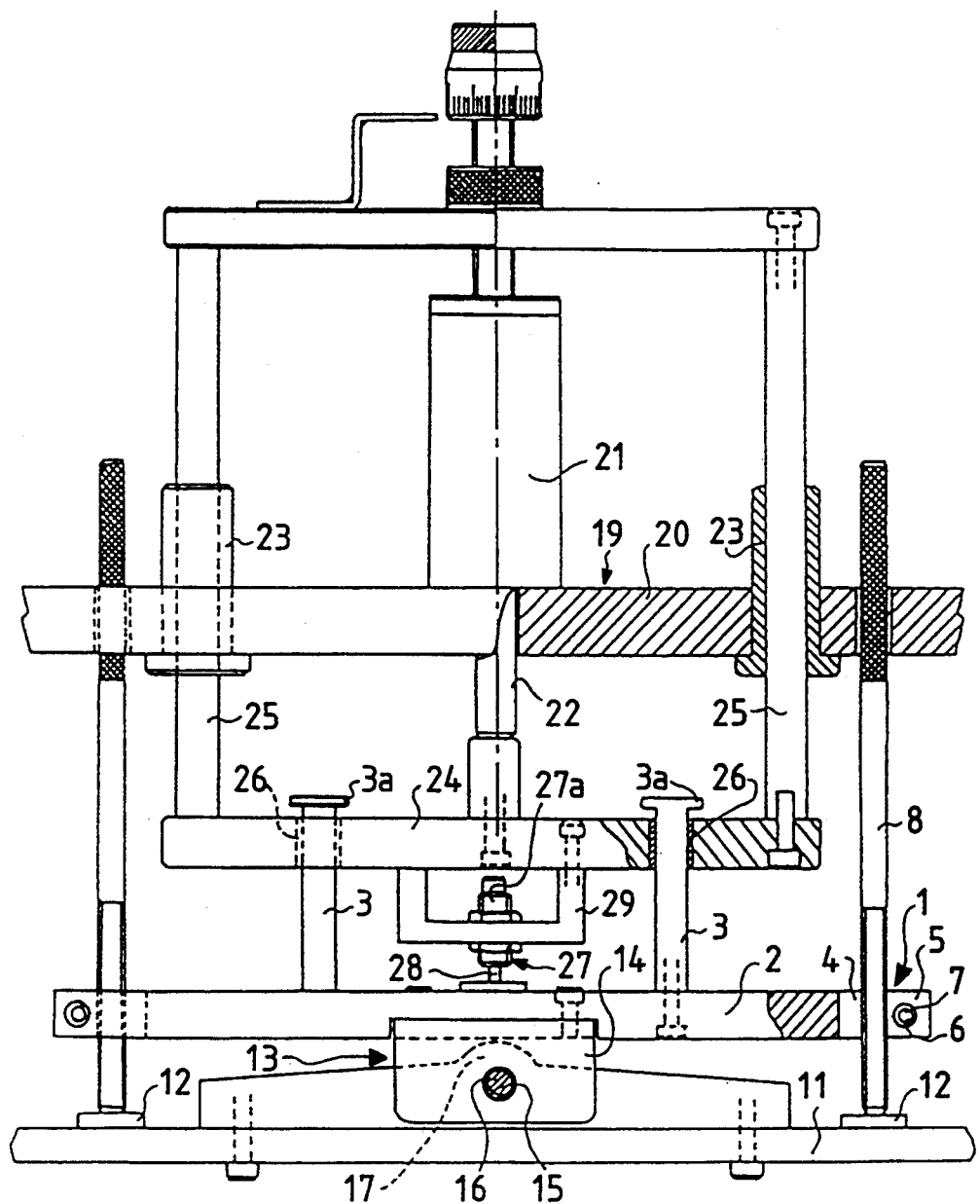
FIG. 2 is an enlarged, partially fragmentary front view showing the main part of the apparatus.

The present invention will now be described with reference to the accompanying drawings.

In the embodiment shown in the drawings, 1 denotes a squeegee apparatus including a vertical movement support rod 2 to be described later, a squeegee clip 9 for fastening and holding a squeegee 10, a squeegee grip support member 11, and a connecting member 13 for connecting the vertical movement support rod 2 and the squeegee clip support member 11.

The vertical movement support rod 2 is mounted on a lower surface of a horizontal movement plate 20 of a squeegee drive section 19. A plurality of guide posts 3 are vertically provided on the vertical movement support rod 2. The guide posts 3, 3 are slidably inserted into slide sleeves 26 provided on a vertical operation rod 24 and are provided with expansion portions 3a, 3a projected from the slide sleeve 26 as stoppers for preventing the removal of the guide posts 3.

A pair of through-holes 4, 4 through which a pair of squeegee contact pressure adjustment shafts being inserted are formed at both end portions of the vertical movement support rod 2 to extend in the vertical direction. Slits 5, 5 are formed on the outside of each through-hole 4, 4 and screw holes 6, 6 are provided perpendicular to each slit 5. A fastening screw 7, 7 are threadedly engaged with the screw holes 6, 6 to thereby shorten a gap of each of the slits 5, 5.

A pair of squeegee contact pressure adjustment shafts 8, 8 are provided for adjusting a contact pressure between the squeegee 10 and a mask. The squeegee clip 9 clamps the squeegee 10. The squeegee clip support member 11 supports the squeegee clip 9. A pair of pressure pieces 12, 12 are horizontally provided where lower end portions of the squeegee contact pressure adjustment shafts 8, 8 of the squeegee clip support member 11 contact the pressure pieces 12.

The connecting member 13 is composed of two connecting pieces 14 and 17. One of the connecting piece 14 has a U-shape in cross section so as to clamp the other connecting piece 17 so that the connecting piece 17 may vertically rotates. Throughholes 15 are formed on side walls of the connecting piece 14. A connecting shaft 16 is inserted into the through holes 15.

The connecting piece 17 is fixed to a central portion of the squeegee clip support member 11. The connecting piece 17 is mounted on the other connecting piece 14 so as to swing in a vertical direction around the above-described connecting shaft 16. Numeral 18 denotes a through-hole for the connecting shaft 16.

The squeegee drive section 19 is formed in the same manner as a well known structure. 20 denotes a horizontal movement plate. An air cylinder 21 is vertically provided on the horizontal movement plate 20. The air cylinder 21 has a moving shaft 22. A pair of guide sleeves 23, 23 are provided on the horizontal movement plate 20.

The vertical operation rod 24 is mounted in between the horizontal movement plate 20 and the vertical movement support rod 2 and is connected in its middle portion to the moving shaft 22 of the air cylinder 21. A plurality of guide posts 25, 25 are vertically provided on the vertical operation rod 24. The guide posts 25, 25 are slidably inserted into the guide sleeves 23, 23. The guide sleeves 26, 26 into which the guide posts 3, 3 for the vertical movement support rod 2 are slidably inserted are provided on the vertical operation rod 24.

A cushioning member 27 imparts a suitable pressure to an operating member 28 which may project or retract relative to a sleeve body 27a by a built-in hydraulic or a built-in spring means (not shown). The cushioning member 27 is vertically fixed to a central lower portion of the vertical operation rod 24 by a support member 29.

With such a construction and an effect of the present invention, even if the mask is partially wavy or deformed, the cushioning effect of the cushioning member allows the squeegee to follow the deformation of the mask. Accordingly, there is no remarkable difference in contact pressure between the flat portions and the corrugated portions of the mask. As a result, it is possible to make a uniform application in the amount of cream solder, ink or the like. Also, unlike the conventional apparatus, there is no excessive contact pressure and the squeegee would not be damaged. Also, the cream solder received in holes of the mask would not be scraped out.

Various details of the invention may be changed without departing from its spirit nor its scope. Furthermore, the foregoing description of the embodiments according to the present invention is provided for the purpose of illustration only, and not for the purpose of limiting the invention as defined by the appended claims and their equivalents.

What is claimed is:

1. A squeegee apparatus for a screen printing machine including a mask and a squeegee, comprising:
    a horizontal movement plate;
    a squeegee drive means comprising an air cylinder means including a moving shaft and secured to a longitudinal central portion of said horizontal movement plate;
    a vertical operation rod secured to said moving shaft of said air cylinder for accomplishing vertical movement of said vertical operation rod with respect to said horizontal movement plate;
    a vertical movement support rod coupled to said vertical operation rod to permit vertical movement with respect to said horizontal movement plate;
    cushioning means connected to said vertical operation rod and said vertical movement support rod at a position below said moving shaft of said air cylinder, said cushioning means allowing cushioned relative vertical movement between said vertical operation rod and said vertical movement support rod;
    connecting means secured to said vertical movement support rod at a position below said cushioning means; and,
    squeegee attachment means rotatably coupled to said connecting means for attachment of a squeegee, said squeegee attachment means being rotatably mounted about an axis parallel to the mask.

2. An apparatus for moving a squeegee against a mask during screen printing comprising:
    a vertical operation rod;
    a squeegee drive means including
    a drive cylinder secured to a horizontal movement plate, said cylinder having a movable shaft connected to said vertical operation rod for moving said rod vertically with respect to said horizontal movement plate;
    a vertical movement support rod vertically movable in response to vertical movement of said vertical operation rod during movement of the squeegee against the mask;
    a cushioning member connecting said vertical movement support rod to the vertical operation rod, said cushioning member providing a cushioning of mask imperfection induced, relative vertical movement occurring between said vertical movement support rod and said vertical operation rod; and,
    a squeegee grip support rotatably connected to said vertical movement support rod, said grip support movable vertically in response to vertical movement of said drive cylinder movable shaft during placement of the squeegee apparatus against the mask, said squeegee grip support also rotatably movable in response to mask imperfections, said grip support being mounted for rotation with respect to said vertical movement support rod about an axis parallel with the mask.

3. A squeegee apparatus in combination with a squeegee drive mechanism which moves a squeegee against a mask during screen printing comprising:
    a vertical movement support rod vertically movable in response to squeegee drive movement during placement of the squeegee apparatus against the mask;
    a cushioning member connecting said vertical movement support rod to the squeegee drive mechanism, said cushioning member providing a cushioning of movement due to mask imperfections, means providing relative vertical movement between said vertical support rod and the squeegee drive mechanism; and,
    a squeegee grip support rotatably connected to said vertical movement support rod, means mounting said grip support for vertical movement in response to squeegee drive movement during placement of the squeegee apparatus against the mask, said squeegee grip support being rotatably movable in response to mask imperfections, means mounting said grip support rotatably with respect to said vertical movement support rod about an axis parallel with the mask.

* * * * *